United States Patent [19]

Patry et al.

[11] 4,247,812
[45] Jan. 27, 1981

[54] METHOD OF CONTROLLING THE RECHARGING OF STORAGE CELLS, AND MONITORING THEIR STATE OF CHARGE

[75] Inventors: Eric Patry, Nogent sur Marne; Pierre Belot, Pavillons sous Bois, both of France

[73] Assignee: Saft-Societe des Accumulateurs Fixes et de Traction, Romainville, France

[21] Appl. No.: 949,539

[22] Filed: Oct. 10, 1978

[30] Foreign Application Priority Data

Oct. 18, 1977 [FR] France .................................. 77 31273

[51] Int. Cl.³ ............................................. H02J 7/04
[52] U.S. Cl. ........................................ 320/44; 320/48
[58] Field of Search ....................... 320/43, 44, 48, 21

[56] References Cited

U.S. PATENT DOCUMENTS

| | | | |
|---|---|---|---|
| 3,735,234 | 5/1973 | Godard | 320/44 |
| 3,898,548 | 8/1975 | Perelle et al. | 320/44 X |
| 3,906,329 | 9/1975 | Bader | 320/48 X |
| 4,012,681 | 3/1977 | Finger et al. | 320/44 X |
| 4,153,867 | 5/1979 | Jungfer | 320/48 X |

*Primary Examiner*—Robert J. Hickey
*Attorney, Agent, or Firm*—Kenyon & Kenyon

[57] ABSTRACT

After a cell has discharged a quantity $Q_o$ of electricity, charging is controlled by measuring the quantity $k\, Q_o$ of electricity supplied to the cell, where k is the recharging coefficient and greater than 1. The value of k is varied as an increasing function of the quantity $Q_o$ of electricity discharged, in other words as an increasing function of the relative depth of discharge $Q_o/C$ of the storage cell, where C is its capacity. The state of charge is monitored by generating a magnitude g which is a function of the charging or discharging current. This is done by algebraically integrating the current I over time while using scaling coefficients $a = g/I$ of different values during charging and during discharging. The value of a is varied during charging so that its average value over a complete recharging operation is a decreasing function of the initial depth of discharge from which the recharging operation starts recharging.

8 Claims, 4 Drawing Figures

METHOD OF CONTROLLING THE RECHARGING OF STORAGE CELLS, AND MONITORING THEIR STATE OF CHARGE

The invention relates to charging storage cells.

It is known that to recharge completely a storage cell which has previously been discharged by a quantity Qo of electricity, a quantity kQo of electricity must be supplied to it, the factor k, which is called the recharging coefficient or factor being greater than 1 and representing the reciprocal of the charging efficiency of the storage cell. The applied recharging factor must be determined carefully: if it is too small, the storage cell will not be sufficiently recharged; if it is too great, the storage cell will be overcharged and this will result in various disadvantages according to the type and mode of use of the storage cell, the least serious of these disadvantages being the necessity for maintaining the electrolyte level in a non-sealed storage cell and the most serious being the destruction of the storage cell by a short-circuit, an explosion or heating as the case may be.

To determine the quantity of electricity necessary for proper recharging, it is known to monitor the state of charge of the storage cell permanently by generating a magnitude g which is proportional to the charging or discharging current I which flows through the cell and by algebraically integrating this magnitude to provide data which is an image of the state of charge of the storage cell. Different proportionality factors $a = g/I$ are chosen for charging and for discharging, to take into account the charging efficiency of the storage cell, and charging is stopped when the image data represents the fully charged state of the storage cell.

When applying the method to the case of a storage cell or of a storage battery (storage cells generally being used in one form of batteries) which are subject to very variable discharge conditions, it is difficult to determine a suitable proportionality factor for charging.

The invention mitigates this difficulty.

The invention provides a method of controlling the recharging of a storage cell consisting in measuring the quantity of electricity which is supplied to it and in stopping the charging when the quantity reaches $kQ_o$, $Q_o$ being the quantity of electricity supplied by the discharging storage cell and k being the recharging factor greater than 1, wherein the recharging factor k is varied as an increasing function of the quantity $Q_o$ of electricity supplied by the discharging storage cell.

This means that the recharging efficiency of a partially discharged storage cell is lower the greater the depth of its discharge has been. The applicant has discovered that this method provides satisfactory recharging of a storage cell.

At first sight, this observation seems paradoxical. Indeed, it is known that when fully charging a storage cell, i.e. when going from the discharged state to the charged state, only a part of the current which flows through the storage cell is effectively used to raise the state of charge of the storage cell, the remainder being dissipated by spurious electrochemical phenomena. The instantaneous charging efficiency, which represents the useful fraction of the current is substantially equal to unity at the beginning of charging and decreases progressively to be nil when the storage cell is fully charged. The average efficiency over any period of charging which ends in the charged state is therefore lower, the higher the state of charge at the beginning of the period; this is apparently in contradiction with the remark which has just been made relating to a partially discharged storage cell.

There is actually no contradiction at all if it is considered that a partially discharged storage cell is not identical to a fully discharged and then partially recharged storage cell. Indeed, among the electrochemically active sites of the storage cell electrodes, some are more accessible than others to electrical and electrochemical exchanges. It is understandable that these sites are the first to be discharged and to be charged. The reduction of the instantaneous efficiency while the battery is charging is explained by the fact that since the electrochemical charging reactions of the active materials become more and more difficult, the competition between these reactions and the spurious reactions tends more and more in favour of the latter reactions until only spurious reactions occur once there remains no chargeable site; this characterizes the charged state of the storage cell. Therefore, in the vicinity of this state, only the least accessible sites remain to be charged and the charging efficiency is very low. In contrast, in a storage cell which is discharged to a small depth, only the most accessible sites are discharged and consequently need to be recharged. The charging efficiency will therefore be high.

This intellectually satisfying theoretical explanation is given by way of hypothesis, but if it turns out to be wrong the value of the invention would not be reduced since the invention is based on a practical solution to the observation, that it is difficult to determine a recharging coefficient which is adapted to a battery at differing depths of discharge.

The invention also provides a method of monitoring the state of charge of a storage cell applicable to the above-defined method of controlling recharging, the method consisting in generating a magnitude g proportional to the charging or discharging current I of the storage cell and in algebraically integrating said magnitude to provide image data which is representative of the state of charge of the storage cell by imparting different values to the coefficient of proportionality $a = g/I$ between said magnitude and said current during charging and discharging and also by varying the value a adopted when the battery is charging so as to obtain on a recharging operation an average coefficient which is a decreasing function of the depth of discharge of the storage cell.

Indeed, the average $a_m$ of the coefficient $a = g/I$ is the ratio $\int g dt / \int I dt$, the integrals extending throughout the recharging period. $\int I dt$ is the quantity of electricity supplied to the storage cell, i.e. $kQ_o$. $\int g dt$ is the difference between the image of the charged state of the storage cell and the image of its state after a discharge of $Q_o$. This difference is equal in absolute value to the integral $\int g_o dt$ recorded during the discharge, i.e. $\int g_o dt = a_o \int I_o dt = a_o Q_o$, where $I_o$ is the discharge current of the storage cell and $a_o$ is the coefficient of proportionality during discharge.

Therefore we have $$a_m = a_o Q_o / k \quad Q_o = a_o / k$$

k is inversely proportional to $a_m$ and by varying $a_m$ as a decreasing function of $Q_o$, an increasing function of $Q_o$ is obtained for k.

In particular, two instantaneous values $a_1$ and $a_2$ can be imparted to the coefficient a during charging.

The invention will be better understood from embodiments described hereinbelow by way of example with reference to the accompanying drawings, in which.

Figure 1A:
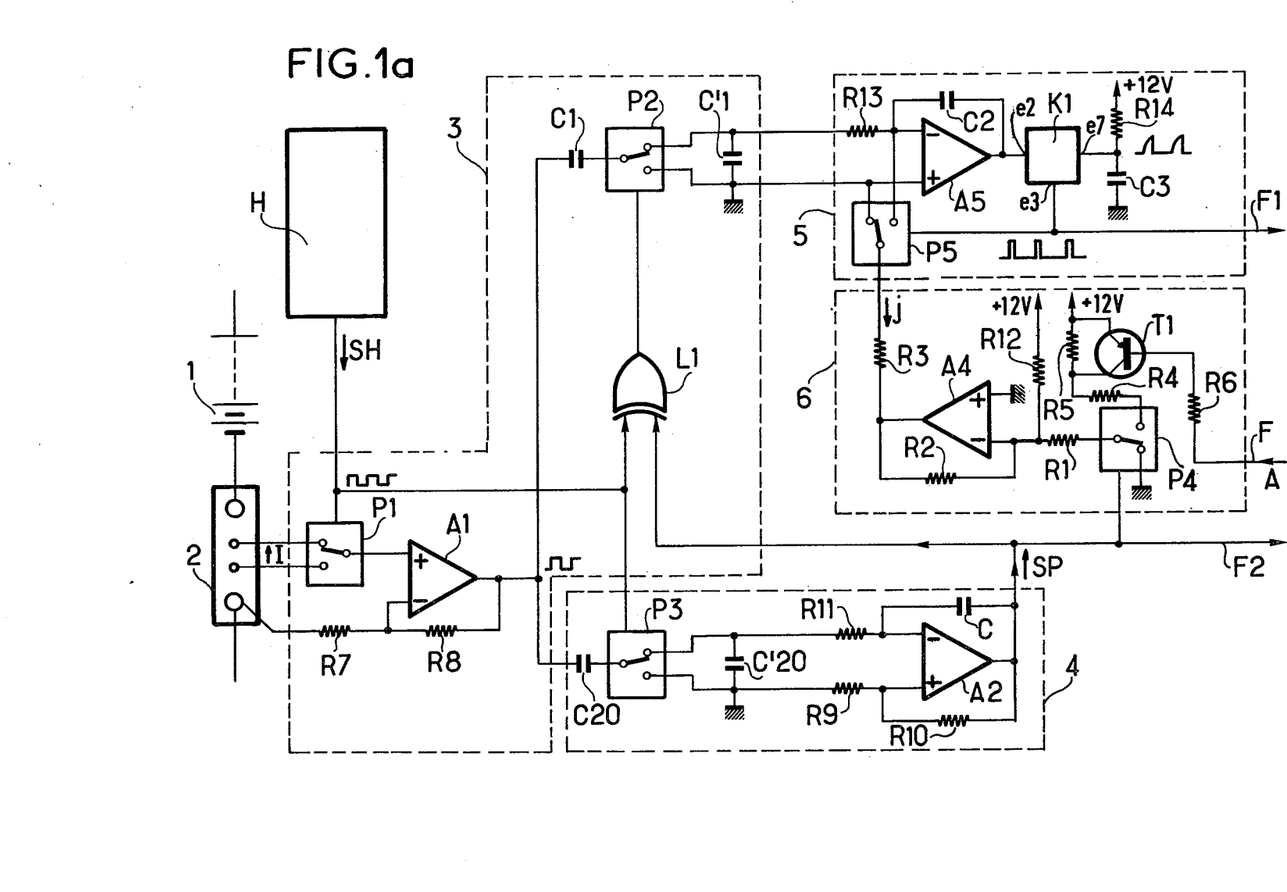
FIGS. 1a and 1b constitute together the circuit diagram of an arrangement in accordance with the invention.

FIG. 1 shows that the charging or discharging current I of a battery 1 passes through current sensing resistor or shunt 2 connected in series with the battery. The voltage across the terminals of the shunt is injected at the input of a chopper amplifier circuit 3. The chopper amplifier circuit includes a first analog changeover swich P1 controlled by a clock H, which is powered by the battery 1. The clock applies a periodic square wave signal SH to the changeover switch P1 at a frequency of 1 kHz for example. The square wave signal is constituted by a zero voltage level during a first alternation and a voltage level of +12 V during the second alternation, these two levels being represented hereinafter respectively by the two figure 0 and 1. The changeover switch P1, being connected by its two contacts to the terminals of the shunt 2 and controlled in this manner, transforms the input voltage into a periodic voltage whose variation in amplitude is equal to the algebraic value of the input voltage.

The chopper amplifier circuit 3 also includes an operational amplifier A1 whose positive input is connected to the common point of the analog changeover switch P1 and whose negative input is connected firstly to the positive terminal of the shunt 2 via a resistor R7 and secondly to the output of the operational amplifier via a resistor R8.

The operational amplifier A1 delivers at its output an amplified alternating voltage whose amplitude is proportional to said periodic voltage and is in phase therewith. The output of the operational amplifier A1 is connected via a capacitor C1 to the common point of a second analog changeover switch P2 which is controlled by the clock signal SH via an exclusive OR logic gate L1; a capacitor C'1 is connected between the two contacts of the analog changeover switch P2 and one of its terminals is connected to earth.

On one of its inputs the gate L1 receives the clock signal SH and on its other input it receives a signal SP; it will be seen hereinafter how the signal SP is generated; it assumes the value 1 while the battery 1 is charging and the value 0 while it is discharging. The output signal of the gate L1, which is applied to the changeover switch P2 is therefore identical to the signal $\overline{SH}$ while the battery is discharging and to the signal $\overline{SH}$ when the battery is charging. The changeover switch P2 therefore operates in synchronism with the changeover switch P1 while the battery is discharging and in opposition thereto while the battery is charging, thereby demodulating the amplified alternating voltage into a voltage of constant sign. After filtering, the demodulated voltage becomes a DC voltage proportional to the amplitude of the amplified alternating voltage, and hence proportional to the current flowing through the shunt 2.

The signal SP is supplied on a wire F2 by a polarity detector 4 which includes a third analog changeover switch P3 controlled by the clock signal SH and whose common point is connected to the output of the operational amplifier A1 via a capacitor $C_{20}$; a capacitor $C'_{20}$ is connected across both contacts of the analog changeover switch P3 and one of its terminals is earthed; a second operational amplifier A2 has its positive input connected firstly to the terminal of the capacitor $C'_{20}$ connected to earth via a resistor R9 and secondly to its output via a resistor R10, the negative input of the operational amplifier A2 is connected firstly to the other terminal of the capacitor $C'_{20}$ via a resistor R11 and secondly to its output via a capacitor C. The analog changeover switch P3 transforms the alternating voltage at the output of the operational amplifier A1 into a DC voltage whose sign is the same as that of the input voltage; this DC voltage is transmitted to the operational amplifier A2 which is connected for voltage hysteresis and whose output delivers the signal SP which represents the direction of the charging or discharging current I of the battery.

The amplified DC voltage which comes from the analog changeover switch P2 is applied to the input of a voltage to frequency converter 5 which will be described hereinafter and which generates a pulse train with a frequency f proportional to the DC voltage and hence to the current I. The frequency f constitutes the magnitude g referred to in the definition of the invention. The coefficient of proportionality a=f/I can be determined by suitable control of the converter 5 by a current generator 6.

The current generator 6 includes an operational amplifier A4 whose positive input is earthed (zero potential) and whose negative input is connected via a resistor R1 to the common point of an analog changeover switch P4 and via a resistor R12 to the +12 V potential. The output of the amplifier A4 is connected to its negative input via a resistor R2 and to the output of the generator via a resistor R3. One of the contacts of the changeover switch P4 is at zero potential and the other is connected to the +12 V potential via a chain of resistors R4 and R5, one of which—R5—is in parallel with the emitter-collector path of a transistor T1. The changeover switch P4 is controlled by the signal SP supplied by the amplifier A2. It connects the resistor R1 to earth, when the battery 1 is discharging (SP=0) and to the resistor R4 when the battery is charging (SP=1). Further, a biassing signal A, conveyed by a wire F, is applied to the base of the transistor T1 via a resistor R6; the biassing signal is a function of an image datum which is representative of the state of charge of the battery 1, supplied by a counting circuit 7 illustrated in FIG. 1b, said counting circuit integrating the pulses generated by the voltage to frequency converter 5. When the image datum indicates a state of charge at least equal to a predetermined value, the value of the biassing signal A is 1 (+12 V); the transistor T1 is therefore blocked and the resistors R4 and R5 are interposed in series between +12 V and the input of the gate P4, which is brought to an intermediate potential between 0 and 12 V. In the contrary case, the value of the biassing signal A is 0; the transistor T1 is saturated and short-circuits the resistor R5. The potential at the input of the changeover switch P4 is therefore higher than previously. Thus, the potential at the output of the changeover switch P4 and hence at the negative input of the amplifier A4 and subsequently the current j generated by the current generator 6 can assume three different values depending on the direction of the current I and on the state of charge of the battery. $j=j_0$ when the battery is discharging; $j=j_1>j_0$ when the battery is charging, while its state of charge is at least equal to the threshold value; and $j=j_2>j_1$ when the battery is charging while its state of charge is lower.

The voltage to frequency converter 5 includes an operational amplifier A5 whose positive and negative inputs receive the amplified DC voltage supplied by the changeover switch P2 of the circuit 3, the positive input being connected to the earthed terminal of the capacitor C'1; the negative input being connected to the other terminal of said capacitor C'1 via a resistor R13 and the output being connected to the input terminal e2 of a monostable circuit K1 which is a 555 type integrated circuit; the input terminal e7 of the monostable circuit K1 is connected firstly to a continuous voltage +12 V via a resistor R14 and secondly to earth via a capacitor C3. A capacitor C2 is connected between the negative input and the output of the operational amplifier A5. The contacts of an analog changeover switch P5 are connected to respective inputs of the operational amplifier. The switch P5 is controlled by the pulses at the frequency f supplied via a lead F1 from the output terminal e3 of the monostable circuit K1. The common point of the analog changeover switch is connected to the output of the current generator 6. A saw-tooth signal is produced at the output of the amplifier A5 and is transformed by the monostable circuit K1 into a train of rectangular pulses, the frequency f of the saw-tooth signal and of the pulse train being proportional to the input voltage of the converter 5, hence to the current which flows through the battery 1 with a coefficient $a=f/I$ which is inversely proportional to the current j produced by the current generator 6.

Figure 1B:
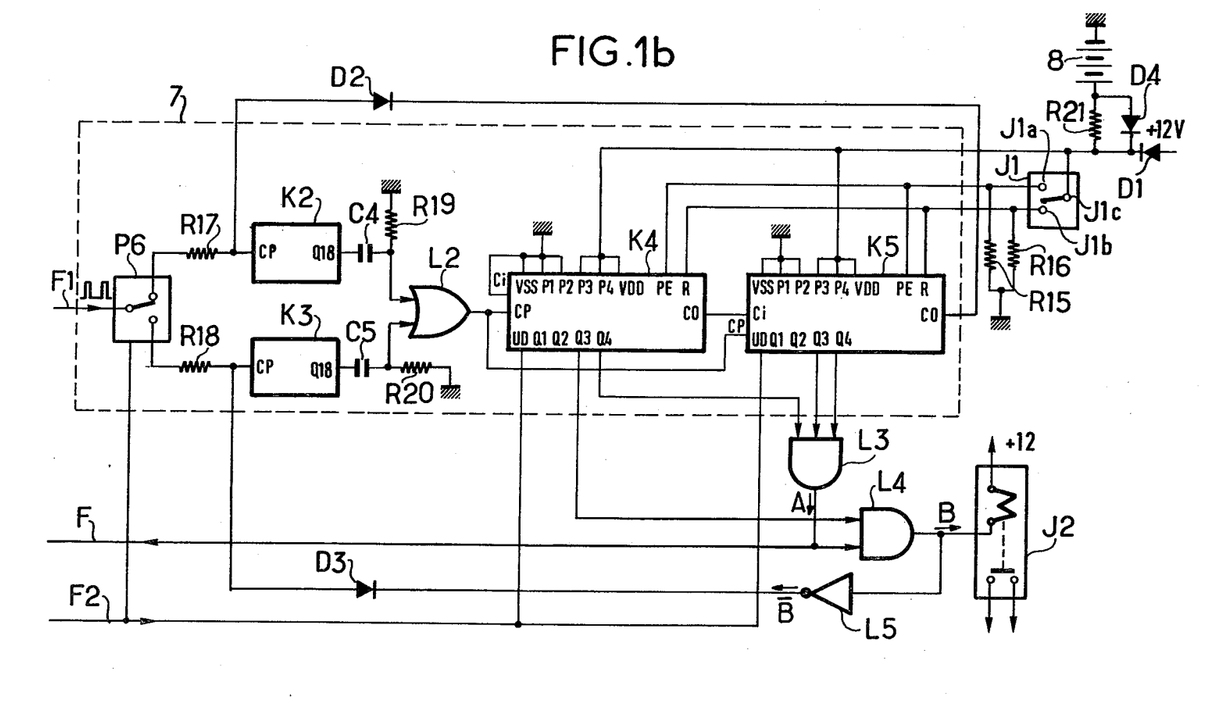

The pulse train at the frequency f is applied via the wire F1 to the common point of an analog changeover switch P6 of the logic counting circuit 7 shown in FIG. 1b. The analog changeover switch P6 is controlled by the signal SP on wire F2 and directs the pulses to a first frequency divider K2 via a resistor R17 when the battery is discharging and to a second frequency divider K3 via a resistor R18 when the battery is charging. The dividers K2 and K3 are type 14 521 integrated circuits. These dividers divide the frequency applied to their inputs CP by $2^{18}$, i.e. when one of them receives the pulse train at the frequency f, it produces a square wave output signal with a frequency of $2^{-18}$ f. The outputs Q18 of the dividers K2 and K3 are connected by respective capacitors C4 and C5 to the inputs of an OR gate L2 in such a way that the appearance of a level 1 at the output of one of the dividers, corresponding to the production of $2^{18}$ pulses by the converter 5, results in the appearance of a temporary level 1 at the output of the gate 12. The point common to the capacitor C4 and to the corresponding input of the OR gate L2 is connected to earth via a resistor R19. The point common to the capacitor C5 and to the corresponding input of the OR gate L2 is connected to earth via a resistor R20. The output of the OR gate is transmitted to the CP inputs of two type 14 516 logic counters K4 and K5, the $\overline{\text{carry out}}$ output Co of the counter K4 being connected to the carry in input Ci of the counter K5. These two counters thus associated together act like a single counter with 256 logic states : (these states will be referred to hereinafter by an eight-digit binary number, the first four digits representing the state of the counter K5 and the last four digits representing the state of the counter K4).

The up/down inputs UD of both counters receive the signal SP which comes from the amplifier A2 via the wire F2, so as to count the pulses they receive positively while the battery is charging and negatively while the battery is discharging. The logic state of the counting circuit therefore results from the algebraic integration of the frequency f, said integration being proportional to the current I which flows through the battery 1 and constitutes an image datum which is representative of the state of charge of the battery.

The inputs P1 and P2 (presets 1 and 2) of the counters K4 and K5 are at the level 0 and their inputs P3 and P4 (presets 3 and 4) are at level 1. The terminals PE (preset enable) of the two counters are connected to a fixed contact J1a of a three-position switch J and to one end of a resistor R15 whose other end is at level 0. The reset terminals R of the counters are connected to another fixed contact J1b of the switch J1 and to one end of a resistor R16 whose other end is also at level 0. The moving contact J1c of the switch J1 is connected to the cathode of a diode D1 whose anode is at the level 1.

The state of the counters is decoded as follows. A diode D2 is connected in the forward direction between the input CP of the divider K2 and the $\overline{\text{carry out}}$ terminal Co of the counter K5. The terminals Q4 of the counters K4 and K5 and Q3 of the counter K5 are connected to the three inputs of a logic AND gate L3 whose output delivers the biassing signal A, the output of the AND gate L3 being connected to the wire F and to an input of a logic AND gate L4; another input of the AND gate L4 is connected to the terminal Q3 of the counter K4. The output of the AND gate L4 is connected to one end of the winding of a relay J2 whose other end is at the potential +12 V, the contacts of the relay being inserted in a circuit (not shown) for charging the battery 1 rapidly. A diode D3 is connected in the forward direction between the input CP of the divider K3 and the output of a logic inverter L5 whose input is connected to the output of the AND gate L4.

The general operation of the arrangement will be described assuming that the battery 1 is used as an emergency battery, i.e. it is normally maintained in the charged state by a charger connected to a source which also supplies a load and for which source the battery is substituted in the case of breakdown. Operation would be the same if the battery were used as a booster battery with suitable regulation of the charging current.

It is assumed that when the arrangement is put into service, the battery 1 is completely charged. Momentarily establishing the connection J1a–J1c via the switch J1 sets the counting circuit in the state 11001100, which constitutes the image of the fully charged state of the battery. The output signals A and B of the gates L3 and L4 respectively are at the level 1 and the signal $\overline{B}$ supplied by the inverter L5 is at level 0. The winding of the relay J2 is not energized and its contacts are open so that no rapid charging current flows through the battery. However, as long as the source operates normally, a trickle charging current is applied to the battery; this produces a signal SP at the level 1, and the analog changeover switch P6 connects the output of the voltage to frequency converter 5 to the divider K3. But the pulses produced by the converter are diverted by the diode D3 and are not taken into account by the counting circuit. Thus, the trickle charging current, which has no effect on the state of charge of the battery, does not modify the state of the counters which is representative thereof.

If the source is no longer available and the battery 1 is required to discharge, the signal SP assumes the level 0 and the pulses of the converter 5 at the frequency of $f_o=a_oI$ ($a_o$ being determined by the current $j_o$) are transmited to the divider K2, then, after division by $2^{18}$, to the counters K4 and K5, which count them negatively. The state of the counters therefore decreases by one unit each time the battery discharges by the quantity $q_o=2^{18}/a_o$. As soon as the state changes, i.e. passes to 11001011, the signal B changes to level 0 and the relay J2 closes. However, as long as this state does not reach 11000111, i.e. as long as the quantity discharged remains less than $4q_o$, the signal A remains at level 1. If the current source is re-established in this time the battery will charge rapidly and the current j produced by the current generator 6 will assume the value $j_1$ whence $a=a_1<a_o$. Since the signal SP returns to level 1 on charging, the pulses produced at the frequency $f_1=a_1I$ will be transmitted to the divider K3, then after division to the counters K4 and K5, whose state rises by one unit each time a quantity of electricity $q_1=2^{18}/a_1$ flows through the battery. A quantity of $Nq_1$ of charge, i.e. a recharging factor $q_1/q_o=a_o/a_1=k_1>1$ must be supplied to the battery in order to return to the original 11001100 state if the battery is discharged by $Nq_o$ where $N \leq 4$.

If, on the contrary, the quantity discharged reaches or exceeds $4q_o$, the state of the counter drops below 11001000 and the signal A drops to level 0. When the source is re-established, we then have $j=j_2$ and $a=a_2<a_1$. If the quantity discharged is $Q_o=Nq_o$ ($N>4$), a remains equal to $a_2$ until the state of the counters returns to 11001000 which corresponds to an increase of N-4 units obtained by the flow of a quantity of electricity $(N-4)\ q_2=(N-4)\ (2^{18}/a_2)$. Since the signal A then changes to 1, the last four units of the state of the counters are added by a quantity of electricity $4q_1=4\times(2^{18}/a_1)$. The recharging factor is then:

$$k = \frac{(N-4)\frac{2^{18}}{a_2} + 4 \times \frac{2^{18}}{a_1}}{N \times \frac{2^{18}}{a_o}} = \frac{a_o}{a_2} - \frac{4}{N}\left(\frac{a_o}{a_2} - \frac{a_o}{a_1}\right)$$

$$k = k_2 - \frac{4}{N}(k_2 - k_1)$$

with $k_2 = \frac{a_o}{a_2}$

If the ratio $4q_o/C$ i.e. the relative depth of discharge which causes the coefficient a to change to the value $a_2$, is designated by $\alpha$, the following equations are obtained:

$k = k_1$ where $Q_o \leq \alpha C$ (I)
$k = k_2 - \frac{\alpha C}{Q_o}(k_2 - k_1)$ where $Q_o \geq \alpha C$ (II)

The applicants have observed that for a sealed nickel-cadmium storage battery with thin sintered electrodes manufactured by them and used in a temperature range of about 5° to 30° C., satisfactory results are obtained by adopting the following values:

$k_1=1.05$ $k_2=1.25$ $\alpha=2.5\%$ (i.e. $q_o=C/160$)

This means that the recharging factor k is equal to $k_1$, i.e. 1.05 for a depth of discharge less than or equal to 2.5% of the capacity and increases from 1.05 to 1.245 when the depth of discharge increases from 2.5 to 100%.

Figure 3:
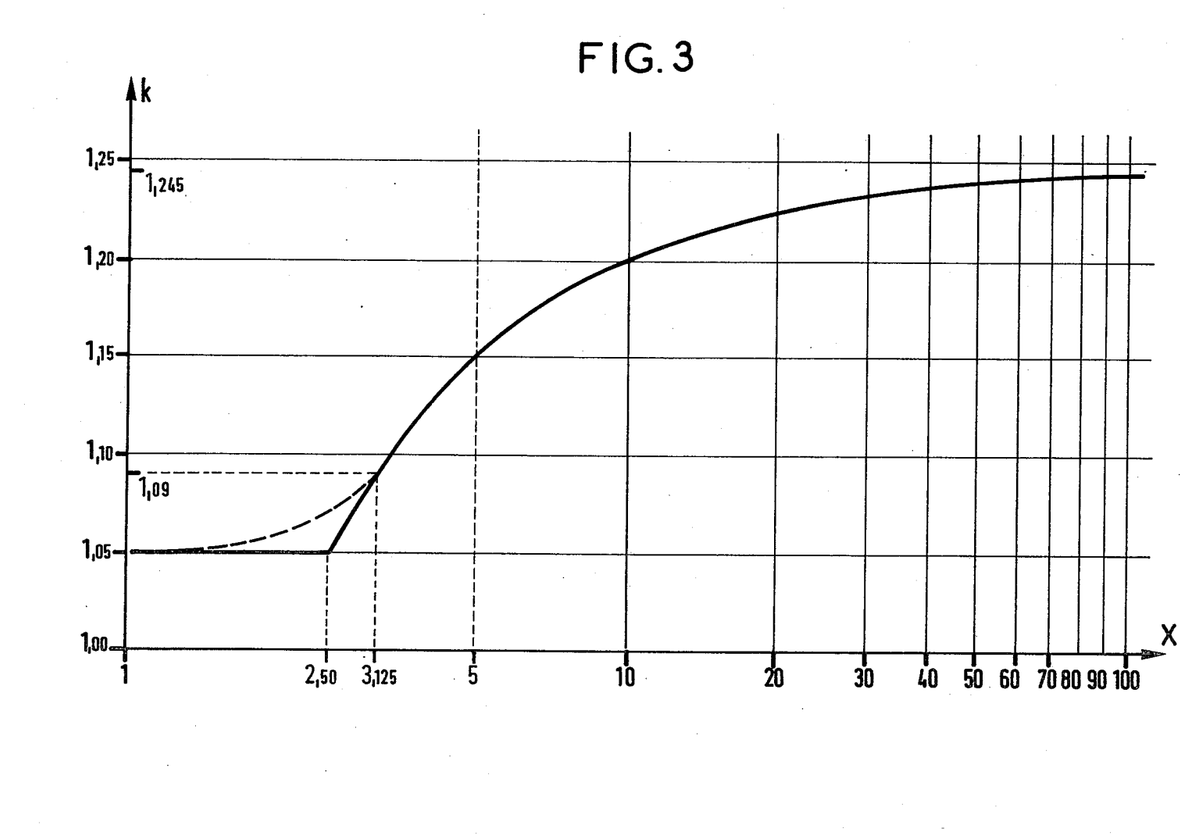
FIG. 3 is a graph representing the variation of the recharging factor as a function of the depth to which the battery is discharges, as supplied by the arrangements of FIGS. 1a, 1b and 2.

The continuous curve in FIG. 3 shows the variation of k as a function of the variable $x=100Q_o/C$, which represents the depth of discharge in %.

The above calculations and the curve in FIG. 3 give the average values, but there can be a difference for a given charging operation. Indeed, because the state of the divider K2 at the beginning of charge and of discharge is unknown, the state of charge of the battery corresponding to a determined change in state of the counters K4 and K5 is uncertain. This uncertainty is $q_o$, i.e. 0.625% of the capacity. If necessary, it could be reduced with a more accurate counting device or by decoding the intermediate states of the dividers.

It is seen that with the numerical values chosen hereinabove, the capacity C of the battery is equal to 160 $q_o$, while the counting circuit is capable of recording a quantity 204 $q_o$ from the state 11001100 to the state 00000000. The counting circuit therefore has "spare capacity" of $(204-160)/160=27.5\%$. Therefore, it is certain that if the battery discharges a quantity of electricity greater than its normal capacity C (the true capacity can indeed vary according to the discharge conditions), the extra quantity will be memorized by the counting circuit. Similarly, the spare capacity allows for the interchange of batteries of the same type even though their capacities may vary between each other.

It should be stressed that the value of $\alpha$ (which is here 2.5%) is not critical and that it can vary, for a same type of storage cell, without detriment to the invention. The essential condition is to apply substantially different recharging coefficients for very small depth of discharge and for great depth of discharge (in this case, about 1.05 and 1.25 respectively).

The $\overline{\text{carry out}}$ signal Co at the output of the counter K5 assumes the level 0 when the counting circuit 7 is in the state 00000000 and is applied to the cathode of the diode D2 to prevent the discharge pulses from bringing the counter to the state 11111111.

The connection J1b—J1c of the switch J1 allows the state of the counter to be fixed at 00000000 when the arrangement is put into service with a completely discharged battery. It will be observed that in as much as the state 00000000 is not representative of the discharged state, putting a battery into service in these conditions will lead to overcharging the battery, but this need not be detrimental provided it is an exceptional occurrence. Thus, in the numerical example given hereinabove, the quantity of electricity charged will be 200 $q_2$ up to the state 11001000 and $4q_1$ thereafter, this making a total of:

$4q_1+200q_2=(4k_1+200k_2)q_o=(4\times1.05+200\times1.25$
$)q_o=254.2q_o=254.2C/160 \simeq 1.59\ C.$ The potential level +12 V used in the arrangement is supplied by a regulated circuit, not shown, which is itself powered by the battery 1. An auxiliary battery 8 (FIG. 1b), formed for example by three nickel-cadmium button-type storage cells with a capacity of 40 mAh, is charged by the +12 V line via the diode D1 and a resistor R21. If the battery 1 is momentarily disconnected, via a diode D4 in parallel with the resistor R21, the auxiliary battery 8 supplies the counters K4 and K5 at a low voltage which is nonetheless sufficient to allow the image data representative of the state of charge of the battery 1 to be retained in the memory.

Figure 2:
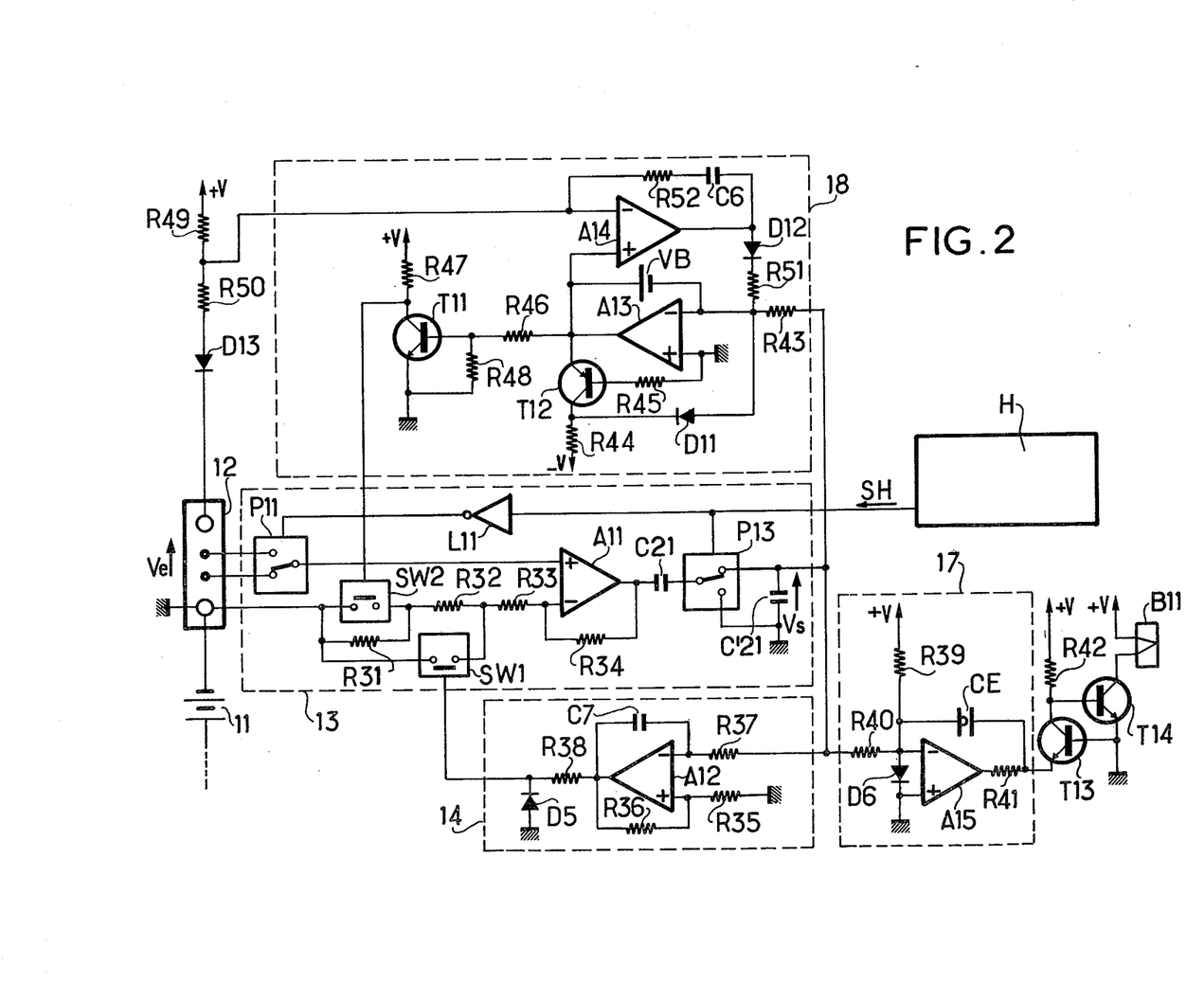
FIG. 2 is a circuit diagram of another arrangement in accordance with the invention.

The arrangement of FIG. 2 also includes a shunt 12 in series with the storage battery 11 under observation; the terminal of the shunt connected to the negative polarity of the battery is earthed; the voltage across the shunt is applied to the input of a chopper amplifier circuit 13. In the latter circuit, the operational amplifier A11 and the analog changeover switches P11 and P13 respectively act as the amplifier A1 and the changeover switches P1 and P3 of the amplifier circuit 3 in FIG. 1a. In contrast, the changeover switch P2 and the gate L1 have no equivalent and the signal SH (such as defined with reference to FIG. 1a) applied to the changeover switch P13 is inverted by a logic inverter L11 before being aplied to the changeover switch P11, so that the amplification circuit 13 produces only one output voltage Vs proportional to the input voltage Ve supplied by the shunt 12, and of opposite sign. Further, the gain of the amplifier circuit can be modified by a chain of resistors R31, R32, R33 connected between the negative input of the amplifier and earth, an analog switch SW2 being connected in parallel with the resistor R31 and another analog switch SW1 being connected in parallel with the chain of resistors R31, R32. Since a resistor R34 is connected between the output and the negative input of the amplifier A11, the voltage gain is:

$$Av = 1 + \frac{R34}{R33}$$ when SW1 is closed $$Av = 1 + \frac{R34}{R32 + R33}$$ when SW1 is open and SW2 is closed $$Av = 1 + \frac{R34}{R31 + R32 + R33}$$ when SW1 and SW2 are both open The arrangement also includes a polarity detector 14 sensitive to the sign of the voltage Vs and causing the switch SW1 to close when Vs is negative (battery 1 discharging) and to open when Vs is positive (battery charging).

The polarity detector 14 comprises an operational amplifier A12 whose positive input is connected firstly to earth via a resistor R35 and secondly to the output of said amplifier via a resistor R36; the negative input is connected firstly to the output of said amplifier via a capacitor C 7 and secondly via a resistor R37 to the non-earthed terminal of the capacitor C'21 which is connected between the two contacts of the changeover switch P13, as in FIG. 1a. The output of the amplifier A12 is connected via a resistor R38 firstly to a control input of the switch SW1 and secondly to earch via a diode D5 in the reverse direction, with its anode earthed.

An integrator 17 comprises an operational amplifier A15 whose positive input is earthed and whose negative input is connected firstly to the voltage+V via a resistor R39 and secondly to the resistor R37 and to the non-earthed terminal of the capacitor C'21 via a resistor R40; the negative input is also connected to the positive input via a diode D6 having its anode connected to the negative input. The output of the amplifier A15 is connected via a resistor R41 firstly to its negative input by an electrolytic cell CE and secondly to the emitter of an NPN type transistor T13. The base of the transistor T13 is earthed and its collector is connected to a positive voltage V via a resistor R42; an NPN type transistor T14 has its base connected to the collector of the transistor T13, its emitter earthed and its collector connected to the positive voltage V via the winding of a relay B11.

The voltage Vs at the output of the chopper amplifier 13 is applied to the input of the amplifier A15 of the integrator 17; the amplifier A15 induces, through the electrolytic cell CE, a current i which is proportional to the output voltage Vs and whose direction depends on the sign of the voltage. Since the output voltage Vs is itself algebraically proportional to the current I which flows through the battery 11, the current i constitutes the magnitude g defined hereinabove and its integration by the electrolytic cell CE leads to image data representative of the state of charge of the battery. When the cell CE reaches the limit of its integration capacity in the battery charging direction, it produces a signal which, by means of the two transistors T13 ans T14, interrupts the supply current of the winding of the relay B11. This state of the cell CE is chosen to be representative of the fully charged state of the battery 11, and the winding of the relay B11 is used to control the opening of a battery rapid charging circuit; rapid charging is therefore interrupted when the image data shows that the battery is fully charged.

The voltage Vs is also applied to the input of an auxiliary integrator circuit 18. The auxiliary integrator circuit includes an operational amplifier A13 whose positive input is earthed and whose negative input is connected via a resistor R43 to the non-earthed terminal of the capacitor C'21 of the chopper amplifier 13; the negative terminal of a low-capacity storage cell VB is connected to the negative input of the amplifier A13, and its positive terminal is connected to the output of said amplifier A13; the output of the amplifier A13 is connected to a negative potential−V via the emitter-collector path of an NPN type transistor T12 and a resistor R44; the base of the transistor T12 is connected to earth via a resistor R45; the negative input of the amplifier A13 is connected to the collector of the transistor T12 via a diode D11 with its cathode connected to the collector. The output of the amplifier A13 is connected via a resistor R46 to the base of an NPN type transistor T11 whose emitter is earthed and whose collector is connected to the positive voltage+V via a resistor R47; the base of the transistor T11 is connected to earth via a resistor R48. The collector of the transistor T11 is connected to a control input of the switch SW2 of the chopper amplifier 13. The output of the amplifier A13 is connected to the positive input of an operational amplifier A14 whose negative input is connected firstly to the positive voltage+V via a resistor R49 and secondly to the non-earthed terminal of the shunt via a resistor R50 and a diode D13 in series, the cathode of the diode being connected to the shunt; a diode D12 in the forward direction and a resistor R51 are connected in series between the output of the amplifier A14 and the negative input of the amplifier A13, while the output of the amplifier A14 and its negative input are connected via a resistor R52 and a capacitor C6 in series.

The action of the amplifier A13 is similar to that of the amplifier A15; the amplifier causes a current i' to flow through the storage cell VB. The current i' can be different from or the same as the current i in the electrolytic cell CE but is strictly proportional to i since i and i' are both proportional to the voltage Vs, with invariable coefficients of proportionality. The storage cell VB therefore constitutes an auxiliary integrator which integrates the current i' which is algebraically proportional to the current I. However, the integration capacity of the integrator, i.e. in this case the capacity c' of the storage cell VB is chosen so that it will correspond to only a fraction of the capacity C of the battery 11, in other words so that the ratio c'/C will be lower than the coefficient of proportionality a'=i'/I.

It is assumed at the outset that the battery 11 is supplied with a trickle charge and that the storage cell VB and the cell CE are fully discharged. The cell CE produces an output signal, and the rapid charging of the battery 11 is interrupted. The voltage of the storage cell VB is maintained at about 0.7 V by the transistor T12. If the source ceases to operate and the battery 11 discharges, a negative voltage Vs is produced by the amplifier stage 13 and the polarity detector 14 closes the switch SW1. The voltage gain of the chopper amplifier 13 is then $Av_o = 1 + R34/R33$, this resulting in a coefficient of proportionality $a_o$ between the charging current $i_o$ of the cell CE and the discharging current $I_o$ of the battery and a coefficient $a'_o$ between the charging current $I_o$ of the cell VB and the discharging current $I_o$. If the quantity of electricity drawn from the battery is sufficient for VB to be completely charged, its end of charge voltage is detected by the amplifier A14 which compares the potential of its positive terminal with that of the point common to the resistors R49 and R50. Indeed, the latter resistor, the diode D13 and the shunt 12 constitute a voltage reference in which the diode compensates for temperature and the shunt compensates for current. The current $i'_o$ is then distributed between the resistor R51 and the storage cell VB so as to maintain simply the charged state of the storage cell. However, the cell CE is charged by the current $i_o$ throughout the whole discharging period of the battery 11 and records the image data representative of the state of charge of the battery.

When the battery is recharged, a positive voltage Vs appears at the output of the chopper amplifier 13, and this results in a discharging current $i_1$ of the cell CE and a discharging current $i'_1$ of the storage cell VB. The polarity detector 14 opens the switch SW1. During discharge of the storage cell VB, its voltage keeps the transistor T11 conductive and the switch SW2 closed. The gain of the amplifier is then $$Av_1 = 1 + \frac{R34}{R32 + R33} < Av_o,$$

whence the values of a and a', $a_1 < a_o$, and $a'_1 < a'_o$. When the voltage of VB drops at the end of discharge, T11 becomes blocked and SW2 opens. We then have $$Av_2 = 1 + \frac{R34}{R31 + R32 + R33} < Av_1,$$

and the battery continues to charge while CE continues to discharge with a coefficient $a_2 < a_1$.

In outline, it may be said that if the quantity $Q_o$ of electricity discharged by the battery does not exceed the quantity $\beta C$ which corresponds to the full charge of the storage cell VB, the duration of the discharge of the storage cell VB coincides with that of the cell CE and a uniform recharging factor $k_1 = a_o/a_1$ will be applied to the battery; in the contrary case, the discharge period of the storage cell VB will be shorter than that of the cell CE, and the charging factor k will lie between $k_1$ and $k_2 = a_o/a_2 > k_1$ and will be greater the deeper the battery discharge is.

More strictly speaking, if it is considered that the charging efficiency of the storage cell VB is lower than 1, while that of the cell CE is substantially equal to 1, it is observed that the duration of the discharge period of the storage cell VB is shorter than that of the cell CE even when it is not fully charged. The following formulas can then be established:

$$k = k_2 - (k_2 - k_1)\rho = k_1 + (k_2 - k_1)(1 - \rho) \quad \text{(III)}$$
where $Q_o < \beta C$ and
$$k = k_2 - (k_2 - k_1)\frac{\beta C}{Q_o} \quad \text{(IV)}$$

where $Q_o \geq \beta C$, $\rho$ being the charging efficiency of the storage cell VB which is the full charging efficiency in formula (IV) and a partial charging efficiency which is a decreasing function of $Q_o$ in formula (III).

Formula (IV) is similar to formula (II) which relates to the previously described arrangement, replacing $\alpha$ by $\rho\beta$. Therefore the same curve will be drawn again with $\beta$ such that $\beta\rho = 2.5\%$, $k_1$ and $k_2$ remaining respectively equal to 1.05 and 1.25. FIG. 3 shows the complete variation curve of k, supposing that $\rho$ varies between 1 and 0.8 when $Q_o$ varies between 0 and $\beta C$, this leading to $\beta = 3.125\%$. The portion of the curve which corresponds to equation III is shown by a dashed line.

If the storage cell VB is replaced by a second electric cell, the equations (I) and (II) will be found again.

Thus, in both embodiments which have just been described, two values $a_1$ and $a_2$ of the coefficient a are used successively to obtain an average coefficient and a recharging factor k which is a function of the depth of discharge of the battery. The variation curve of k is approximately the same in both cases and is suitable for nickel-cadmium storage cells manufactured by the Applicants (the values of $k_1$ and $k_2$ can be adapted to various types of storages cells). If necessary, the form of the curve can be changed by using more than two instantaneous coefficients. Another way of varying the recharging factor in accordance with the invention is to adopt a coefficient of proportionality a which is uniform throughout recharging but whose value depends on the depth of discharge i.e. on the image datum which is representative of the state of charge such as it appears at the beginning of recharging. All these variants can be produced easily when the image data is constituted by the state of a logic counting circuit by decoding the appropriate states.

Other changes can be made in the arrangements described without going beyond the scope of the invention. Thus, the coefficients of proportionality a can also be varied as a function of temperature to take into account the variation of the battery charging efficiency at extreme temperatures. For example, in the circuit of FIG. 1a, a temperature probe in thermal contact with the battery can be connected to the resistor R4 so as to affect the input potential of the analog changeover switch P4 concurrently with the signal A. Further, means can be provided to produce a magnitude g greater than zero when no current flows through the battery, to represent the self-discharge thereof. This can be done in the circuit of FIG. 1a by positively biasing the negative input of the amplifier A5 via a high resistance. This biasing, which is too small to have an effect when a voltage is amplified by the chopper amplifier 3, produces in the contrary case, very low frequency pulses by means of the converter 5; these pulses are counted negatively, since the signal SP is at level 0 when no voltage is detected by the polarity detector 4. Thus, the image data can take into account the self-discharge of the battery when there is no current.

The chopper amplifier stage used in the two arrangements can be replaced by any other amplifier circuit, and similarly any means can be used to generate a magnitude g proportional to the current I; the magnitude g can be a magnitude other than a frequency or a current. The integrated circuits which are commercially available components can be replaced by equivalent components, and the combinations of integrated circuits can be replaced by equivalent or partially equivalent combinations or components so as to perform only the essential functions of the arrangements described. The battery can be recharged by any type of charger which can perform rapid charging or which can charge permanently, or which can perform rapid or trickle charging alternatively. In this respect, the reference made in the present specification to stopping the charging of a fully charged battery can mean either that any charging current is cut off, or that rapid charging is replaced by trickle charging chosen so as to keep the battery in the charged state without the disadvantages of overcharging. Further, when a charger charges permanently, the battery is necessarily permanently overcharged, and consequently the image datum which represents the fully charged state is not used to stop charging. In this case, the method of monitoring the state of charge in accordance with the invention can be applied, for example, to indicating the state of charge of the battery by permanently reading the image data or to indicating a critical depth of discharge.

We claim:

1. A method of controlling the recharging of a storage cell comprising determining the quantity of electricity $Q_o$ supplied by the cell during a period of discharge; measuring the quantity of electricity which is supplied to it during recharging following said discharge period; and stopping the charging when the quantity reaches $kQ_o$, k being a recharging factor greater than 1, wherein the recharging factor k is varied as an increasing function of the quantity $Q_o$ of electricity supplied by the discharging storage cell.

2. A method of controlling the recharging of a storage cell according to claim 1, wherein the quantity $Q_o$ is determined by monitoring the state of charge of the storage cell; generating a magnitude g proportional to the charging or discharging current I of the storage cell; algebraically integrating said magnitude to provide image data which are representative of the state of charge of the storage cell by imparting different values to a coefficient of proportionality $a = g/I$ between said magnitude and said current during charging and during discharging, respectively, and also by varying the value a adopted when the battery is charging so as to obtain on a recharging operation an average coefficient which is a decreasing function of the depth of discharge of the storage cell.

3. A method according to claim 2, wherein the coefficient of proportionality a can be varied by imparting either one of two instantaneous values $a_1$ and $a_2$ when the battery is charging.

4. A method according to claim 3, wherein the step of imparting either one of two instantaneous values $a_1$ and $a_2$ when the battery is charging comprises:

imparting a value $a_1 > a_2$ to the coefficient of proportionality a during the recharging period of a storage cell which has previously discharged by a quantity less than or equal to a limit value $\alpha C$, and imparting the value $a_1$ to the coefficient of proportionality a during part of the charging period to recharge the battery when it discharges by a quantity greater than $\alpha C$, and imparting the value $a_2$ to the coefficient of proportionality during the remainder of the charging period.

5. A method according to claim 4, wherein said monitoring step comprises continuously comparing said image data when the battery is charging with the value which is representative of the state of discharge corresponding to the discharged quantity $\alpha C$ and imparting as the coefficient of proportionality either $a_1$ or $a_2$ according to whether the instantaneous quantity discharged is less than or greater than $\alpha C$, respectively.

6. A method according to claim 2 or 5, wherein the step of algebraically integrating said magnitude g to provide the image data comprises algebraically counting pulses proportional to the charging or discharging current I of the storage cell in a logic counting circuit and detecting the state of the logic counting circuit by a logic decoding circuit.

7. A method according to claim 3 or 4, further comprising algebraically integrating in an auxiliary integrator a magnitude g′ proportional to the charging or discharging current I, where the magnitude g′ can be different from or the same as the magnitude g, the integration capacity of the auxiliary integrator being limited in relation to the capacity of the storage cell, delivering a signal from the auxiliary integrator when its integration limit is reached in the charging direction of the storage cell, and imparting the value $a_1$ to the coefficient of proportionality when the signal is not delivered and the value $a_2$ to the coefficient of proportionality when the signal is delivered.

8. A method according to claim 7, wherein the auxiliary integrator is an auxiliary storage cell with a smaller capacity than that of the storage cell which is to be monitored, and wherein the step of integrating the magnitude g′ comprises charging the auxiliary storage cell when the storage cell to be monitored discharges and vice-versa, and wherein the end of discharge voltage of the auxiliary storage cell is used as said integration limit signal.

* * * * *